United States Patent
Chi et al.

(10) Patent No.: US 10,916,278 B1
(45) Date of Patent: Feb. 9, 2021

(54) MEMORY CONTROLLER AND MEMORY DATA RECEIVING METHOD FOR GENERATE BETTER SAMPLING CLOCK SIGNAL

(71) Applicant: Realtek Semiconductor Corp., HsinChu (TW)

(72) Inventors: Kuo-Wei Chi, Hsinchu (TW); Chun-Chi Yu, Hsinchu County (TW); Chih-Wei Chang, Hsinchu County (TW); Gerchih Chou, San Jose, CA (US); Shih-Chang Chen, Miaoli County (TW); Fu-Chin Tsai, Taipei (TW); Shih-Han Lin, Hsinchu County (TW); Min-Han Tsai, Taichung (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/575,353

(22) Filed: Sep. 18, 2019

(51) Int. Cl.
*G11C 7/22* (2006.01)

(52) U.S. Cl.
CPC ...... *G11C 7/222* (2013.01); *G11C 2207/2254* (2013.01)

(58) Field of Classification Search
CPC ............ G11C 7/222; G11C 2207/2254; G11C 29/842; G06F 1/12
See application file for complete search history.

(56) References Cited

U.S. PATENT DOCUMENTS

| 2016/0035411 A1* | 2/2016 | Yu ..................... G11C 11/4076 365/189.07 |
| 2017/0097655 A1* | 4/2017 | Jeon ........................ G06F 1/12 |

* cited by examiner

*Primary Examiner* — David Lam
(74) *Attorney, Agent, or Firm* — Winston Hsu (57) ABSTRACT

A memory controller comprising: a delay circuit, configured to use a first delay value and a second delay value to respectively delay a sampling clock signal to generate a first and a second delayed sampling clock signal; a sampling circuit, configured to use a first edge of the first delayed sampling clock signal to sample a data signal to generate a first sampling value, and configured to use a second edge of the second delayed sampling clock signal to sample the data signal to generate a second sampling value; and a calibrating circuit, configured to generate a sampling delay value according to the first delay value based on the first sampling value and the second sampling value. The delay circuit uses the sampling delay value to generate an adjusted sampling clock signal and the sampling circuit sample the data signal by the adjusted sampling clock signal.

17 Claims, 6 Drawing Sheets

MEMORY CONTROLLER AND MEMORY DATA RECEIVING METHOD FOR GENERATE BETTER SAMPLING CLOCK SIGNAL

BACKGROUND OF THE INVENTION

1. Field of the Invention

The present invention relates to a memory controller and a memory data receiving method, and particularly relates to a memory controller and a memory data receiving method which can generate a better sampling clock signal.

2. Description of the Prior Art

A conventional memory controller uses a sampling clock signal from a memory to sample a data signal from the memory while receiving the data signal. However, if the phase of the sampling clock signal is not well selected, the sample value may be incorrect.

SUMMARY OF THE INVENTION

Therefore, one objective of the present invention is to provide a memory controller which can use a sampling clock signal having a proper sampling phase to sample the memory data.

Another objective of the present invention is to provide a memory data receiving method which can use a sampling clock signal having a proper sampling phase to sample the memory data.

One embodiment of the present invention provides a memory controller comprising: a delay circuit, configured to receive a sampling clock signal from a memory, configured to use a first delay value to delay the sampling clock signal to generate a first delayed sampling clock signal, and configured to use a second delay value to delay the sampling clock signal to generate a second delayed sampling clock signal; a sampling circuit, configured to receive a data signal from the memory, configured to use a first edge of the first delayed sampling clock signal to sample the data signal to generate a first sampling value, and configured to use a second edge of the second delayed sampling clock signal to sample the data signal to generate a second sampling value; and a calibrating circuit, configured to generate a sampling delay value according to the first delay value based on the first sampling value and the second sampling value. The delay circuit uses the sampling delay value to generate an adjusted sampling clock signal and the sampling circuit sample the data signal by the adjusted sampling clock signal.

Another embodiment of the present invention provides a memory data receiving method comprising: (a) using a first delay value to delay a sampling clock signal from a memory to generate a first delayed sampling clock signal; (b) using a second delay value to delay the sampling clock signal to generate a second delayed sampling clock signal; (c) using a first edge of the first delayed sampling clock signal to sample the data signal to generate a first sampling value; (d) using a second edge of the second delayed sampling clock signal to sample the data signal to generate a second sampling value; (e) generating a sampling delay value according to the first delay value based on the first sampling value and the second sampling value; and (f) using the sampling delay value to generate an adjusted sampling clock signal and sampling the data signal by the adjusted sampling clock signal.

In view of above-mentioned embodiments, a sampling clock signal having a proper sampling phase can be used while receiving the memory data, to make sure the sampled memory data is correct.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided to explain the concept of the present invention. Please note the terms "first", "second", or the like are only for defining different components or signals, but do not mean to limit the sequences thereof.

Figure 1:
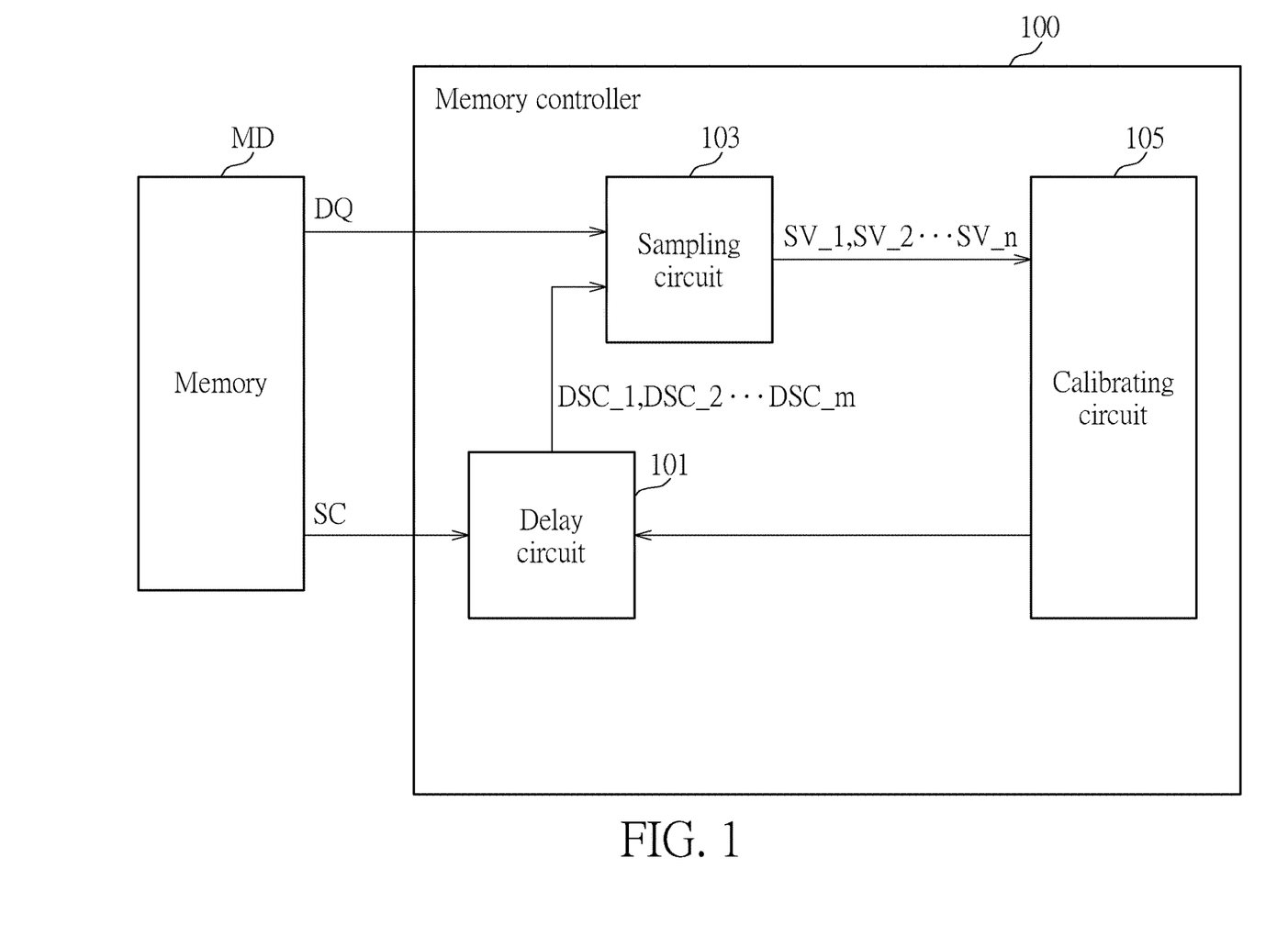
FIG. 1 is a block diagram illustrating a memory controller according to one embodiment of the present.

FIG. 1 is a block diagram illustrating a memory controller 100 according to one embodiment of the present. As illustrated in FIG. 1, the memory controller 100 comprises a delay circuit 101, a sampling circuit 103 and a calibrating circuit 105. The delay circuit 101 is configured to receive a sampling clock signal SC from a memory M and respectively uses different delay values to delay the sampling clock signal SC to generate delayed sampling clock signals DSC_1, DSC_2 ... DSC_m, wherein m is a positive integer. The sampling circuit 103 is configured to receive a data signal DQ from the memory MD, and configured to use edges of different delayed sampling clock signals to sample the data signal DQ to generate different sampling values SV_1, SV_2 ... SV_n, wherein n is a positive integer. m and n can be the same but can be different as well. The calibrating circuit 105 is configured to adjust the delay value of the delay circuit 101 according to at least two of the sampling values SV_1, SV_2 ... SV_n.

Figure 2:
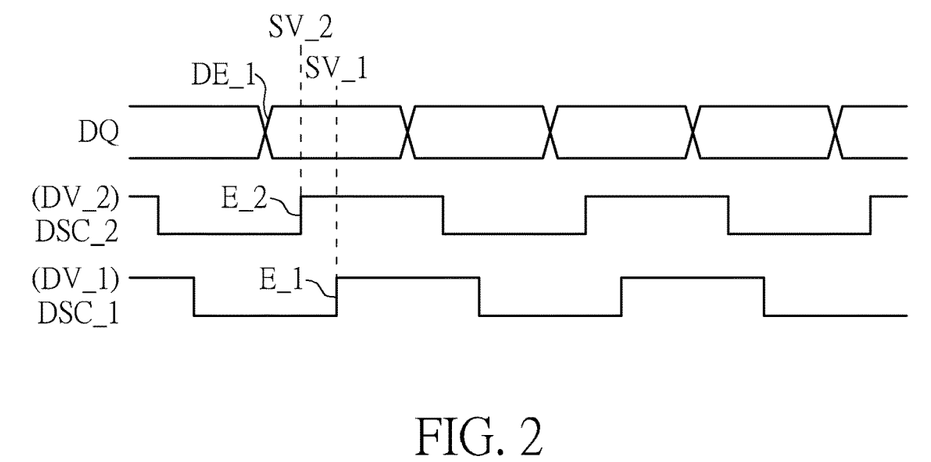
FIG. 2, FIG. 3 and FIG. 4 are schematic diagrams illustrating operations of the memory controller in FIG. 1 according to different embodiments of the present invention.
Figure 3:
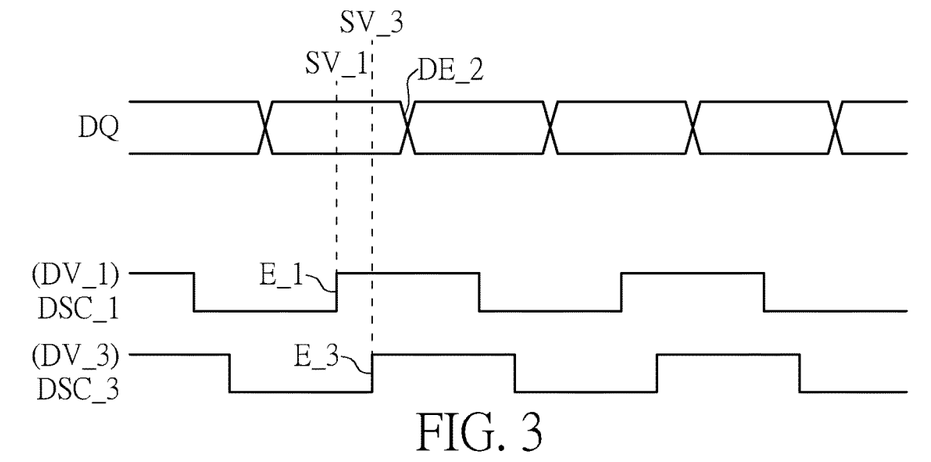
Figure 4:
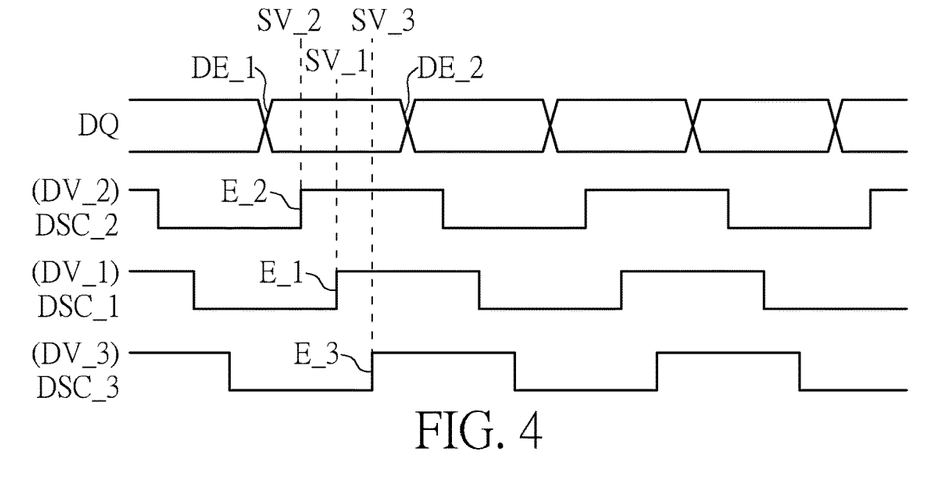

FIG. 2, FIG. 3 and FIG. 4 are schematic diagrams illustrating operations of the memory controller 100 in FIG. 1 according to different embodiments of the present invention. In the embodiments of FIG. 2 and FIG. 3, the above-mentioned m and n are 2. Also, in the embodiment of FIG. 4, the above-mentioned m and n are 3. However, m and n can be any positive integer besides 2 and 3.

In the embodiment of FIG. 2, the delay circuit 101 uses a delay value DV_1 to delay the sampling clock signal DSC to generate a delayed sampling clock signal DSC_1, and uses another delay value DV_2 to delay the sampling clock signal SC to generate a delayed sampling clock signal DSC_2. The delay value DV_1 is larger than the delay value DV_2. That is, a phase of the delayed sampling clock signal DSC_2 leads a phase of the delayed sampling clock signal DSC_1. Further, as illustrated in FIG. 2, the delayed sampling clock signal DSC_1 has an edge E_1 and the delayed sampling clock signal DSC_2 has an edge E_2. In the embodiment of FIG. 2, the edges E_1, E_2 are rising edges, but at least one of the edges E_1, E_2 can be a falling edge. Further, in the embodiment of FIG. 2, the edge E_2 is an edge of the delayed sampling clock signal DSC_2 which is closest to the edge E_1 among all edges of the delayed sampling clock signal DSC_2.

The sampling circuit 103 uses the edge E_1 to sample the data signal DQ to generate a sampling value SV_1, and uses the edge E_2 to sample the data signal DQ to generate a sampling value SV_2. If the sampling values SV_1 and SV_2 are the same, it means the edge E_1 is near a center of the data signal DQ, thus the delayed sampling clock signal DSC_1 has a good sampling phase and the calibrating circuit 105 does not adjust the delay value DV_1. That is, the calibrating circuit 105 directly uses the delay value DV_1 as a sampling delay value, and the delay circuit 101 uses the sampling delay value to generate an adjusted sampling clock signal to sample the data signal DQ. On the contrary, if the sampling values SV_1 and SV_2 are different, it means the edge E_1 is near a data edge DE_1 of the data signal DQ, thus the delayed sampling clock signal DSC_1 has a poor sampling phase and the calibrating circuit 105 adjusts the delay value DV_1. For more detail, the calibrating circuit 105 adjusts the delay value DV_1 to generate the sampling delay value, and the delay circuit 101 uses the sampling delay value to generate an adjusted sampling clock signal and the sampling circuit samples the data signal DQ by the adjusted sampling clock signal. For example, if the sampling values SV_1 and SV_2 are different, it means the edge E_1 is close to the data edge DE_1, thus the delay value DV_1 is increased such that the edged E_1 is closer to the center of the data signal DQ. Please note, if the delay value DV_1 is not adjusted, the first delayed clock signal DSC_1 is served as the adjusted sampling clock signal.

In the embodiment of FIG. 3, the delay circuit 101 uses a delay value DV_1 to delay the sampling clock signal DSC to generate a delayed sampling clock signal DSC_1, and uses another delay value DV_3 to delay the sampling clock signal SC to generate a delayed sampling clock signal DSC_3. The delay value DV_1 is smaller than the delay value DV_3. That is, a phase of the delayed sampling clock signal DSC_1 leads a phase of the delayed sampling clock signal DSC_3. Similar with the operation of FIG. 2, the sampling circuit 103 uses the edge E_1 to sample the data signal DQ to generate a sampling value SV_1, and uses the edge E_3 to sample the data signal DQ to generate a sampling value SV_3. In the embodiment of FIG. 3, the edge E_3 is an edge of the delayed sampling clock signal DSC_2 which is closest to the edge E_1 among all edges of the delayed sampling clock signal DSC_3.

If the sampling values SV_1 and SV_3 are the same, the calibrating circuit 105 directly uses the delay value DV_1 as a sampling delay value, and the delay circuit 101 uses the sampling delay value to generate an adjusted sampling clock signal to sample the data signal DQ. On the contrary, if the sampling values SV_1 and SV_2 are different, the calibrating circuit 105 adjusts the delay value DV_1 to generate the sampling delay value, and the delay circuit 101 uses the sampling delay value to generate an adjusted sampling clock signal to sample the data signal DQ. For example, if the sampling values SV_1 and SV_3 are different, it means the edge E_1 is close to a data edge DE_2 of the data signal DQ, thus the delay value DV_1 is decreased such that the edged E_1 is closer to the center of the data signal DQ.

For the embodiments of FIG. 2 and FIG. 3, the m and n in FIG. 1 are 2. Also, for the embodiment of FIG. 4, the m and n in FIG. 1 are 3. The embodiment of FIG. 4 can be regarded as a combination of the embodiments of FIG. 2 and FIG. 3.

In the embodiment of FIG. 4, the delay circuit 101 uses a delay value DV_1 to delay the sampling clock signal DSC to generate a delayed sampling clock signal DSC_1, uses another delay value DV_2 to delay the sampling clock signal SC to generate a delayed sampling clock signal DSC_2, and uses another delay value DV_3 to delay the sampling clock signal SC to generate a delayed sampling clock signal DSC_3. The delay value DV_1 is larger than the delay value DV_2 but smaller than the delay value DV_3. That is, a phase of the delayed sampling clock signal DSC_1 leads a phase of the delayed sampling clock signal DSC_3 and lags a phase of the delayed sampling clock signal DSC_2. The sampling circuit 103 respectively uses the edge E_1, E_2, E_3 to sample the data signal DQ to generate sampling value SV_1, SV_2 and SV_3.

If the sampling values SV_1, SV_2 and SV_3 are the same, the calibrating circuit 105 directly uses the delay value DV_1 as a sampling delay value, and the delay circuit 101 uses the sampling delay value to generate an adjusted sampling clock signal to sample the data signal DQ. On the contrary, if the sampling values SV_1, SV_3 are the same, but the sampling values SV_1 and SV_2 are different, it means the edge E_1 is close the data edge DE_1, thus the calibrating circuit 105 increases the delay value DV_1 such that the edge E_1 is closer to the center of the data signal DQ. Also, if the sampling values SV_1, SV_2 are the same, but the sampling values SV_1 and SV_3 are different, it means the edge E_1 is close the data edge DE_2, thus the calibrating circuit 105 decreases the delay value DV_1 such that the edge E_1 is closer to the center of the data signal DQ.

The calibrating operations illustrated in the above-mentioned embodiments can be performed periodically. Also, the calibrating operation can be performed before each data receiving operation. Besides, in one embodiment, the calibrating operations can be performed more than one times for each data receiving operation, and a best delay value DV_1 is selected from the plurality of the delay values DV_1 acquired in these calibrating operations.

The delay circuit 101 in FIG. 1 can be a delay chain comprising a plurality of delay stages coupled in series. Also, the calibrating circuit 105 can be a circuit comprising a plurality of logic gates which can compare the sampling values SV_1 ... SV_n and to accordingly output a signal to control the delay circuit 101. Further, the calibrating circuit 105 can be a processor installed with at least one program, thus can compare the sampling values SV_1 ... SV_n and to accordingly output a signal to control the delay circuit 101.

Figure 5:
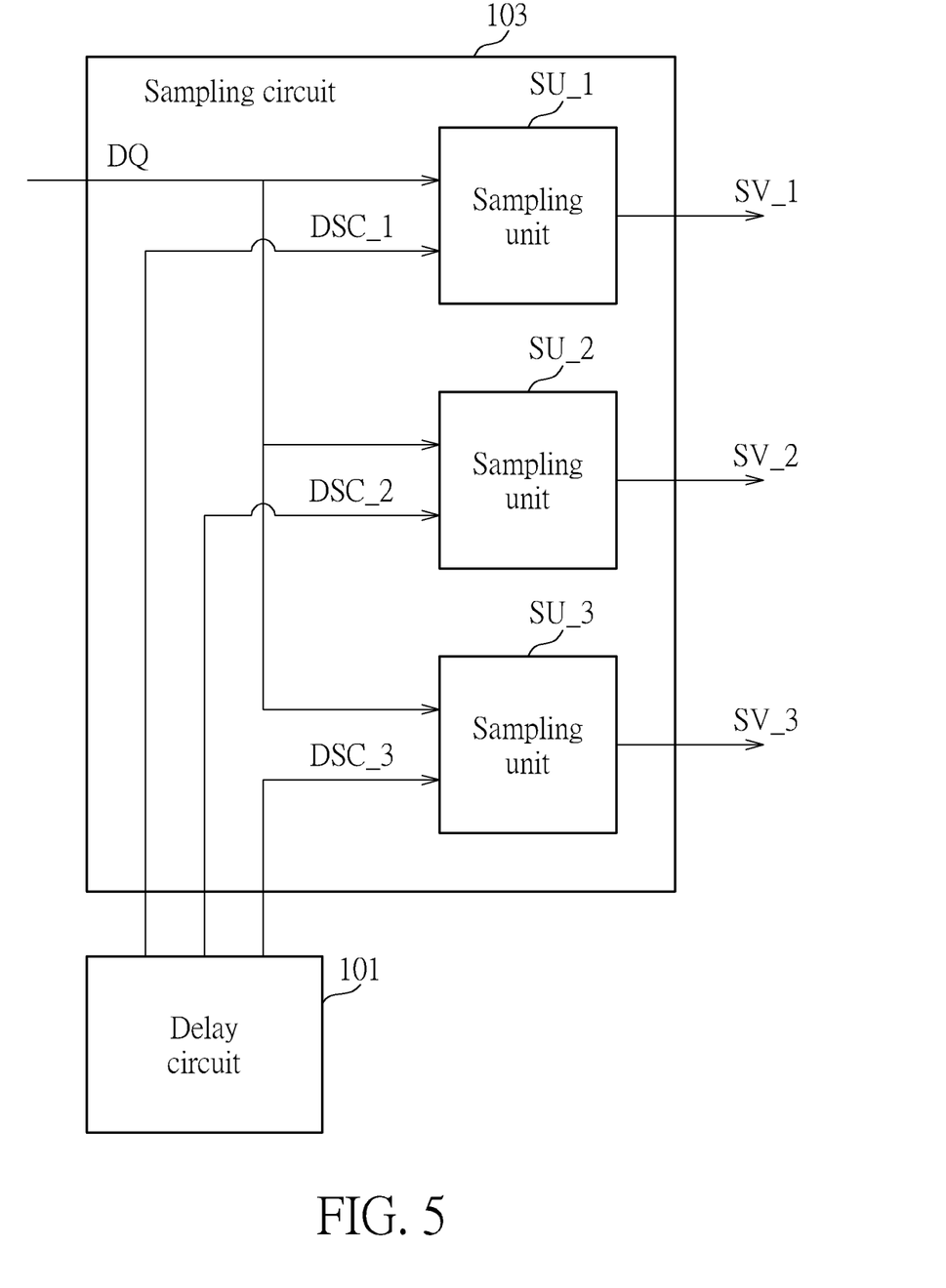
FIG. 5 is a circuit diagram illustrating a circuitry of the sampling circuit according to one embodiment of the present invention.

Additionally, the sampling circuit 103 can comprise various circuitries. FIG. 5 is a circuit diagram illustrating a circuitry of the sampling circuit 103 according to one embodiment of the present invention. As illustrated in FIG. 5, the sampling circuit 103 comprises a plurality of sampling units SC_1, SC_2 ..., which can be flip flops or any other component that can sample the data signal DQ according to the delayed sampling clock signals DSC_1, DSC_2 ... DSC_n. In this example, the number of the sampling unit is 3, which corresponds to the embodiment of FIG. 4.

As illustrated in FIG. 5, the sampling unit SU_1 samples the data signal DQ by the delayed sampling clock signal DSC_1 to generate the sampling value SV_1, the sampling unit SU_2 samples the data signal DQ by the delayed sampling clock signal DSC_2 to generate the sampling value SV_2, and the sampling unit SU_3 samples the data signal DQ by the delayed sampling clock signal DSC_3 to generate the sampling value SV_3. However, the circuitry of the sampling circuit 103 is not limited to the embodiment illustrated in FIG. 5.

Figure 6:
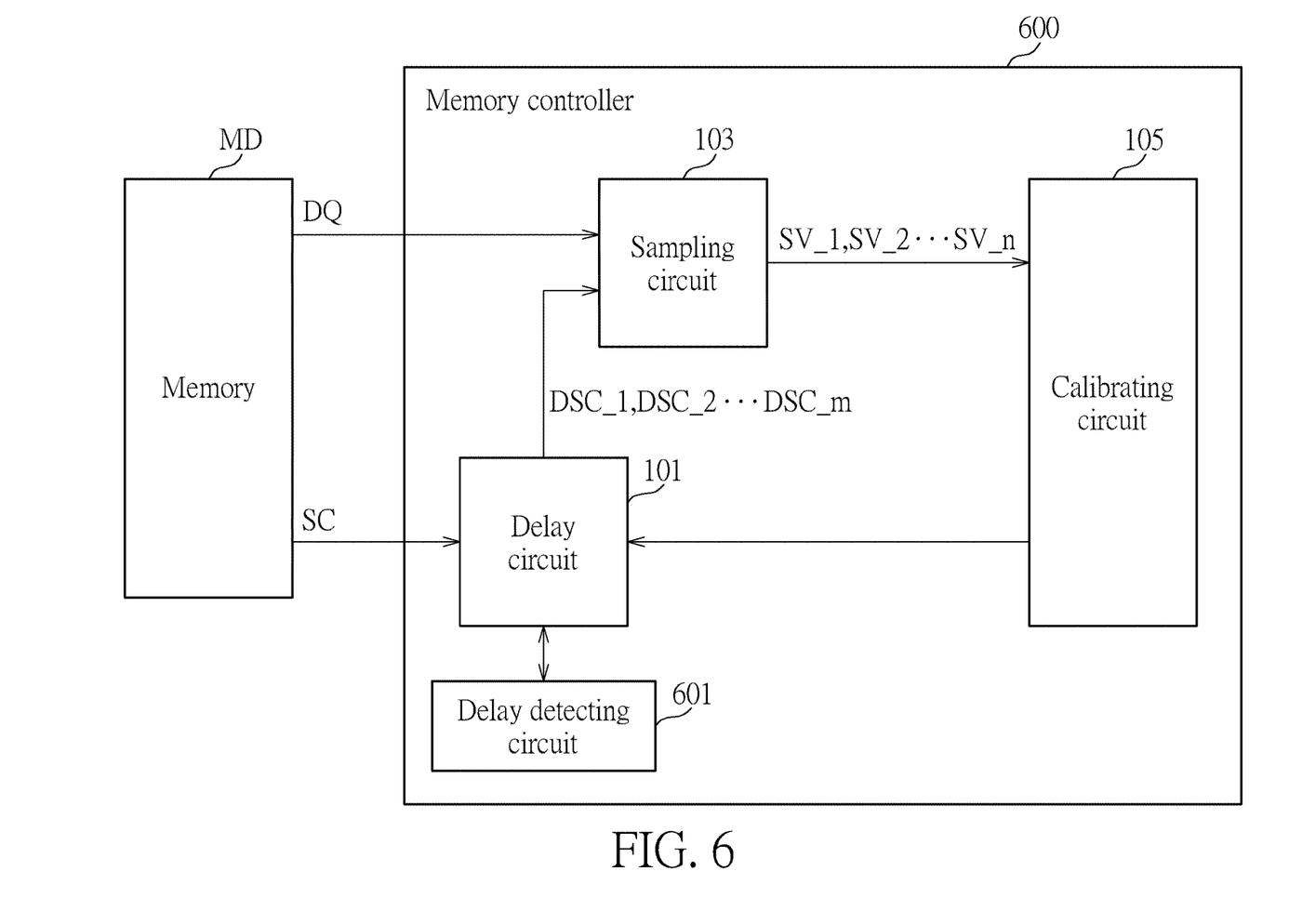
FIG. 6 is a block diagram illustrating a memory controller according to another embodiment of the present.

Since the delay value provided each delay stage of the delay circuit 101 may be affected by various factors such as a temperature or voltage. The memory controller provided by the present invention can further provide a mechanism to compensate it. FIG. 6 is a block diagram illustrating a memory controller 600 according to another embodiment of the present. Besides the delay circuit 101, the sampling circuit 103 and the calibrating circuit 105, the memory controller 600 further comprises a delay detecting circuit 601 which can detect whether at least one the delay interval between the edges of different delayed clock signals fall in a predetermined interval and accordingly controls the delay interval to fall in the predetermined interval.

Figure 7:
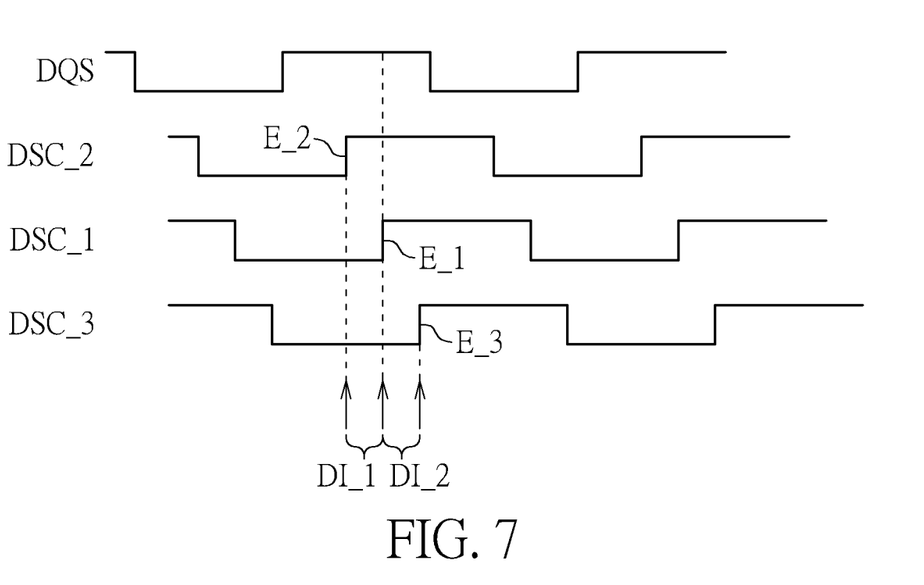
FIG. 7 is a schematic diagram illustrating the operation of the memory controller in FIG. 6 according to one embodiment of the present invention.

FIG. 7 is a schematic diagram illustrating the operation of the memory controller 600 in FIG. 6 according to one embodiment of the present invention, which corresponds to the embodiment of FIG. 3. As illustrated in FIG. 7, the delay detecting circuit 601 detects a delay interval DI_1 between the edges E_1 and E_2 and a delay interval DI_2 between the edges E_1 and E_3. Also, the delay detecting circuit 601 controls the delay interval DI_1 to fall in a first predetermined interval and controls the delay interval DI_2 to fall in a second predetermined interval. Many methods can be used to change the delay interval. For example, the delay detecting circuit 601 can change a number of the delay stages used to generate the delayed sampling clock signal DSC_1 or change a number of the delay stages used to generate the delayed sampling clock signal DSC_2 to adjust the delay interval DI_1.

The first predetermined interval and the second predetermined interval can be the same, and can be different as well. By this way, the variations of the delay interval DI_1 and the delay interval DI_2 due to the variations of the delay values provided by the delay stages can be compensated. If the delay values provided by the delay stages are not compensated, the delay interval D1, D2 may be too larger or to small, to affect the determination of the calibrating circuit 105. It will appreciated that the concept discloses in FIG. 6 and FIG. 7 can be implemented to the embodiments illustrated in FIG. 2 and FIG. 3, and can be implemented to any other memory controller provided by the present invention.

Figure 8:
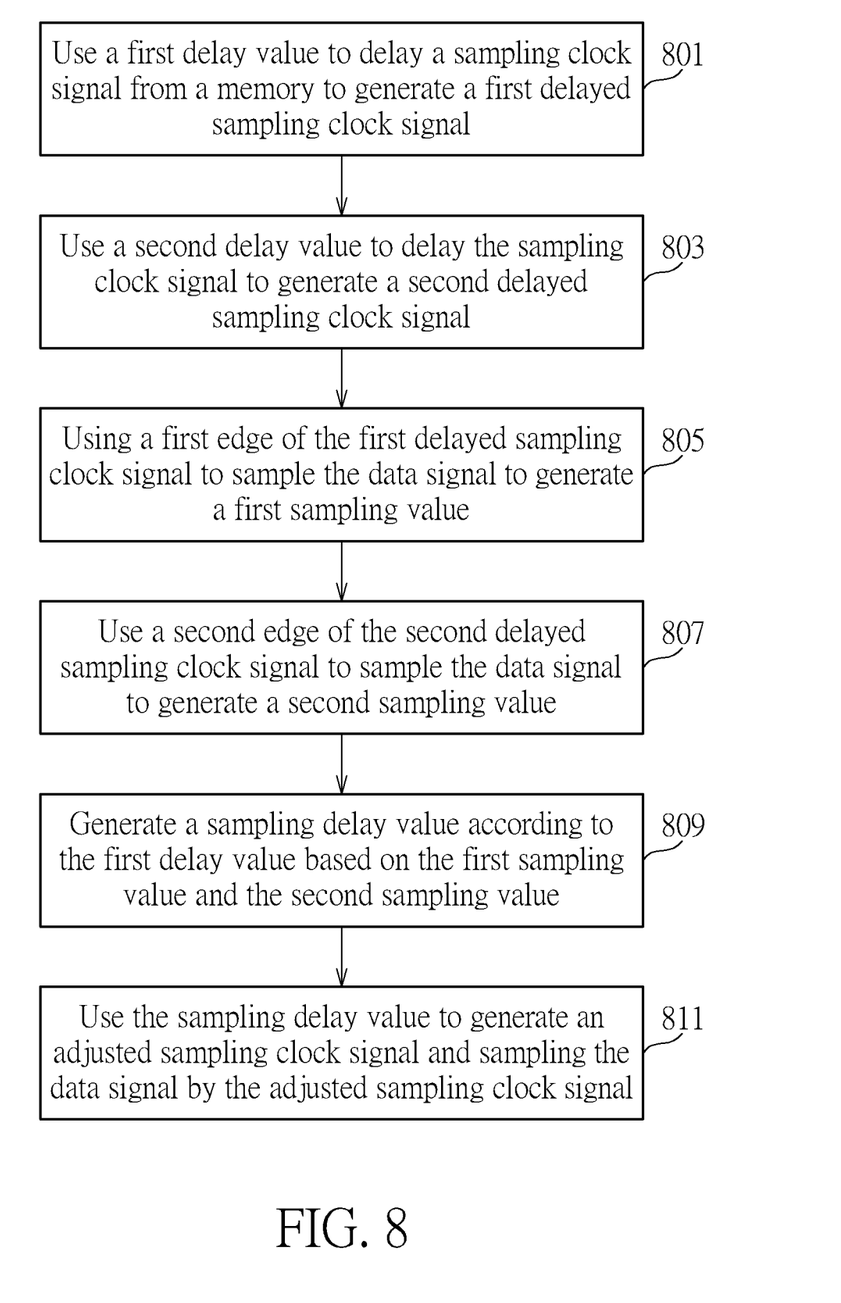
FIG. 8 is a flow chart illustrating a memory data receiving method according to one embodiment of the present invention.

Based upon above-mentioned embodiments, a memory data receiving method can be acquired, which comprises the steps illustrated in FIG. 8:

Step 801
Use a first delay value to delay a sampling clock signal (e.g. SC in FIG. 1) from a memory to generate a first delayed sampling clock signal (e.g. DSC_1 in FIG. 2 or FIG. 3).

Step 803
Use a second delay value to delay the sampling clock signal to generate a second delayed sampling clock signal (e.g. DSC_2 in FIG. 2 or DSC_3 in FIG. 3).

Step 805
Using a first edge (e.g. E_1 in FIG. 2 or FIG. 3) of the first delayed sampling clock signal to sample the data signal to generate a first sampling value (e.g. SV_1 in FIG. 2 or FIG. 3).

Step 807
Use a second edge (e.g. E_2 in FIG. 2 or E_3 in FIG. 3) of the second delayed sampling clock signal to sample the data signal to generate a second sampling value (e.g. SV_2 in FIG. 2 or SV_3 in FIG. 3).

Step 809
Generate a sampling delay value according to the first delay value based on the first sampling value and the second sampling value. The first delay value itself is the sampling delay value in the case that the first delay value is not adjusted.

Step 811
Use the sampling delay value to generate an adjusted sampling clock signal and sampling the data signal by the adjusted sampling clock signal. The first delay clock signal itself is the adjusted sampling clock signal in the case that the first delay value is not adjusted.

The details of the memory data receiving method can be acquired in view of above-mentioned embodiments, thus are omitted for brevity here.

In view of above-mentioned embodiments, a sampling clock signal having a proper sampling phase can be used while receiving the memory data, to make sure the sampled memory data is correct.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller, comprising:
   a delay circuit, configured to receive a sampling clock signal from a memory, configured to use a first delay value to delay the sampling clock signal to generate a first delayed sampling clock signal, and configured to use a second delay value to delay the sampling clock signal to generate a second delayed sampling clock signal;
   a sampling circuit, configured to receive a data signal from the memory, configured to use a first edge of the first delayed sampling clock signal to sample the data signal to generate a first sampling value, and configured to use a second edge of the second delayed sampling clock signal to sample the data signal to generate a second sampling value; and
   a calibrating circuit, configured to generate a sampling delay value according to the first delay value based on the first sampling value and the second sampling value;
   wherein the delay circuit uses the sampling delay value to generate an adjusted sampling clock signal and the sampling circuit sample the data signal by the adjusted sampling clock signal;
   wherein the second edge is an edge of the second delayed sampling clock signal which is closest to the first edge among all edges of the second delayed sampling clock signal, wherein the calibrating circuit adjusts the first delay value to generate the sampling delay value when the first sampling value and the second sampling value are different and uses the first delay value as the sampling delay value when the first sampling value and the second sampling value are the same.

2. The memory controller of claim 1, wherein the first delay value is larger than the second delay value.

3. The memory controller of claim 1, wherein the first delay value is smaller than the second delay value.

4. The memory controller of claim 1,
wherein the delay circuit further uses a third delay value to delay the sampling clock signal to generate a third delayed sampling clock signal and the sampling circuit uses a third edge of the third delayed sampling clock signal to sample the data signal to generate a third sampling value;
wherein the first delay value is larger than the second delay value and smaller than the third delay value;
wherein the calibrating circuit generates the sampling delay value according to the first delay value and based on the first sampling value, the second sampling value and the third sampling value.

5. The memory controller of claim 4, wherein the calibrating circuit adjusts the first delay value to generate the sampling delay value when the first sampling value is different from the second sampling value or the third sampling value, and uses the first delay value as the sampling delay value when the first sampling value, the second sampling value and the third sampling value are the same.

6. The memory controller of claim 4, wherein the third edge is an edge of the third delayed sampling clock signal which is closest to the first edge among all edges of the third delayed sampling clock signal, wherein the memory controller further comprises a delay detecting circuit configured to control a delay interval between the first edge and the second edge to fall in a first predetermined interval and to control a delay interval between the first edge and the third edge to fall in a second predetermined interval.

7. The memory controller of claim 1, wherein the memory controller further comprises a delay detecting circuit configured to control a delay interval between the first edge and the second edge to fall in a predetermined interval.

8. A memory data receiving method, comprising:
(a) using a first delay value to delay a sampling clock signal from a memory to generate a first delayed sampling clock signal;
(b) using a second delay value to delay the sampling clock signal to generate a second delayed sampling clock signal;
(c) using a first edge of the first delayed sampling clock signal to sample the data signal to generate a first sampling value;
(d) using a second edge of the second delayed sampling clock signal to sample the data signal to generate a second sampling value;
(e) generating a sampling delay value according to the first delay value based on the first sampling value and the second sampling value; and
(f) using the sampling delay value to generate an adjusted sampling clock signal and sampling the data signal by the adjusted sampling clock signal;
wherein the second edge is an edge of the second delayed sampling clock signal which is closest to the first edge among all edges of the second delayed sampling clock signal, wherein the step (e) adjusts the first delay value to generate the sampling delay value when the first sampling value and the second sampling value are different and uses the first delay value as the sampling delay value when the first sampling value and the second sampling value are the same.

9. The memory data receiving method of claim 8, wherein the first delay value is larger than the second delay value.

10. The memory data receiving method of claim 8, wherein the first delay value is smaller than the second delay value.

11. The memory data receiving method of claim 8, further comprising:
using a third delay value to delay the sampling clock signal to generate a third delayed sampling clock signal and using a third edge of the third delayed sampling clock signal to sample the data signal to generate a third sampling value;
wherein the first delay value is larger than the second delay value and smaller than the third delay value;
wherein the step (e) generates the sampling delay value according to the first delay value and based on the first sampling value, the second sampling value and the third sampling value.

12. The memory data receiving method of claim 11, wherein the step (e) adjusts the first delay value to generate the sampling delay value when the first sampling value is different from the second sampling value or the third sampling value, and uses the first delay value as the sampling delay value when the first sampling value, the second sampling value and the third sampling value are the same.

13. The memory data receiving method of claim 11,
wherein the third edge is an edge of the third delayed sampling clock signal which is closest to the first edge among all edges of the third delayed sampling clock signal;
wherein the memory data receiving method further comprises controlling a delay interval between the first edge and the second edge to fall in a first predetermined interval and controlling a delay interval between the first edge and the third edge to fall in a second predetermined interval.

14. The memory data receiving method of claim 8,
wherein the memory data receiving method further comprises controlling a delay interval between the first edge and the second edge to fall in a predetermined interval.

15. A memory controller, comprising:
a delay circuit, configured to receive a sampling clock signal from a memory, configured to use a first delay value to delay the sampling clock signal to generate a first delayed sampling clock signal, and configured to use a second delay value to delay the sampling clock signal to generate a second delayed sampling clock signal;
a sampling circuit, configured to receive a data signal from the memory, configured to use a first edge of the first delayed sampling clock signal to sample the data signal to generate a first sampling value, and configured to use a second edge of the second delayed sampling clock signal to sample the data signal to generate a second sampling value; and
a calibrating circuit, configured to generate a sampling delay value according to the first delay value based on the first sampling value and the second sampling value;
wherein the delay circuit uses the sampling delay value to generate an adjusted sampling clock signal and the sampling circuit sample the data signal by the adjusted sampling clock signal;
wherein the delay circuit further uses a third delay value to delay the sampling clock signal to generate a third delayed sampling clock signal and the sampling circuit uses a third edge of the third delayed sampling clock signal to sample the data signal to generate a third sampling value;
wherein the first delay value is larger than the second delay value and smaller than the third delay value;
wherein the calibrating circuit generates the sampling delay value according to the first delay value and based on the first sampling value, the second sampling value and the third sampling value.

16. The memory controller of claim 15, wherein the calibrating circuit adjusts the first delay value to generate the sampling delay value when the first sampling value is different from the second sampling value or the third sampling value, and uses the first delay value as the sampling delay value when the first sampling value, the second sampling value and the third sampling value are the same.

17. The memory controller of claim 15, wherein the second edge is an edge of the second delayed sampling clock signal which is closest to the first edge among all edges of the second delayed sampling clock signal the and the third edge is an edge of the third delayed sampling clock signal which is closest to the first edge among all edges of the third delayed sampling clock signal, wherein the memory controller further comprises a delay detecting circuit configured to control a delay interval between the first edge and the second edge to fall in a first predetermined interval and to control a delay interval between the first edge and the third edge to fall in a second predetermined interval.

\* \* \* \* \*